United States Patent
Lavery et al.

(10) Patent No.: US 7,760,006 B2
(45) Date of Patent: Jul. 20, 2010

(54) METHOD AND SYSTEM TO REDUCE ELECTROMAGNETIC RADIATION FROM SEMICONDUCTOR DEVICES

(75) Inventors: Kevin P. Lavery, Sugar Land, TX (US); Jim D. Childers, Missouri City, TX (US); Pravin P. Patel, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/117,435

(22) Filed: May 8, 2008

(65) Prior Publication Data
US 2009/0278568 A1 Nov. 12, 2009

(51) Int. Cl.
*H03K 17/16* (2006.01)
*H03K 19/003* (2006.01)
(52) U.S. Cl. .................. 327/391; 327/384; 327/112; 327/170; 326/9; 326/15; 326/82; 326/83
(58) Field of Classification Search .......... 326/21, 326/26, 27, 56, 58; 327/112, 170, 384, 391
See application file for complete search history.

(56) References Cited

U.S. PATENT DOCUMENTS

| | | | |
|---|---|---|---|
| 4,983,860 A | 1/1991 | Yim et al. | |
| 5,005,156 A | 4/1991 | Takai | |
| 5,537,060 A * | 7/1996 | Baek | 326/87 |
| 5,568,062 A * | 10/1996 | Kaplinsky | 326/27 |
| 5,877,647 A * | 3/1999 | Vajapey et al. | 327/391 |
| 6,184,730 B1 * | 2/2001 | Kwong et al. | 327/112 |
| 6,466,063 B2 * | 10/2002 | Chen | 327/112 |
| 6,466,487 B1 | 10/2002 | Otsuka | |
| 6,768,363 B2 * | 7/2004 | Yoo et al. | 327/170 |
| 2006/0176087 A1 * | 8/2006 | Gupta et al. | 327/108 |

* cited by examiner

*Primary Examiner*—Vibol Tan
(74) *Attorney, Agent, or Firm*—Mirna Abyad; W. James Brady; Frederick J. Telecky, Jr.

(57) ABSTRACT

Reducing electromagnetic radiation from semiconductor devices. At least some of the illustrative embodiments are methods comprising driving a Boolean state to a signal pad of a semiconductor device (the driving through a transistor with a first drain-to-source impedance during the driving), and maintaining the Boolean state applied to the signal pad through the transistor with a second drain-to-source impedance, higher than the first drain-to-source impedance.

14 Claims, 4 Drawing Sheets

METHOD AND SYSTEM TO REDUCE ELECTROMAGNETIC RADIATION FROM SEMICONDUCTOR DEVICES

BACKGROUND

Electronic devices, like processors and microcontrollers, radiate undesired electromagnetic energy, which undesired electromagnetic energy may interfere with the operation of other electronic devices. There are several promulgated standards with which products must conform regarding acceptable levels of electromagnetic radiation. For example, consumer electronics in the United States are designed and/or shielded such that the electromagnetic radiation is below certain standards set by the Federal Communication Commissions (FCC). Similarly, electronics used in automobiles are designed and/or shielded to meet more stringent electromagnetic radiation standards, such as those set by the Society of Automotive Engineers (SAE) or the equivalent International Organization for Standards (ISO) standards.

Thus, identification of sources of electromagnetic radiation from semiconductor devices, and corresponding methods and systems to reduce the electromagnetic radiation, are desirable to help manufacturer's products meet or exceed applicable standards.

SUMMARY

At least some of the illustrative embodiments are methods comprising driving a Boolean state to a signal pad of a semiconductor device (the driving through a transistor with a first drain-to-source impedance during the driving), and maintaining the Boolean state applied to the signal pad through the transistor with a second drain-to-source impedance, higher than the first drain-to-source impedance. Driving with the second drain-to-source impedance attenuates alternating current (AC) signals, on the direct current (DC) voltage busses, which AC signals are fed to the signal pads and contribute to electromagnetic radiation from the signal pads.

BRIEF DESCRIPTION OF THE DRAWINGS

For a detailed description of at least some exemplary embodiments, reference will now be made to the accompanying drawings in which.

NOTATION AND NOMENCLATURE

Figure 1:
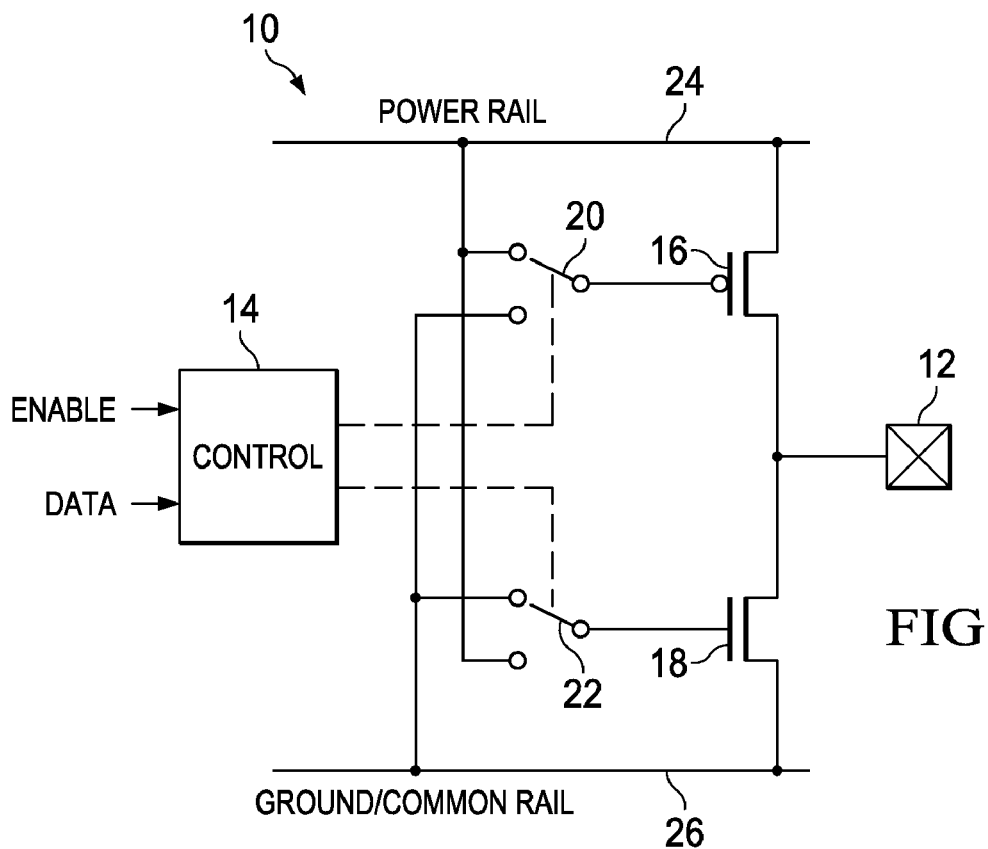
FIG. 1 shows buffer circuit.

Certain terms are used throughout the following description and claims to refer to particular system components. As one skilled in the art will appreciate, companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

"Assert" and "asserted", in reference to Boolean values, indicates a transition to, and/or a particular, predetermined state, but that predetermined state may take either a high voltage or a low voltage. That is, a Boolean value may be asserted high or asserted low. Likewise, "de-assert" or "de-asserted" indicates a transition to, and/or a particular, predetermined state opposite that of the asserted state.

"Drive" and "driving" shall mean forcing a conductive element (e.g., signal pad of a semiconductor device or a gate of a transistor) to a particular voltage level, including forcing to a substantially zero voltage level.

"Logic high voltage" and "logic low voltage" shall mean Boolean values defined relative to each other (e.g., logic high voltage of approximately 3.3 volts and logic low voltage approximately 0 volts, logic high voltage of approximately 0 volts and logic low voltage of approximately −3.3 volts).

"Gate" in reference to a transistor shall mean not only the gate of a field effect transistor (FET), but also the base of a junction transistor. "Drain" in reference to a transistor shall mean not only the drain of a FET, but also the collector of junction transistor. "Source" in reference to a transistor shall mean not only the source of a FET, but also the emitter of junction transistor.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to reducing electromagnetic radiation from a semiconductor device. In particular, the inventors of the present specification have found that output signal pads on semiconductor devices (and/or the signal pins coupled to the output signal pads) tend to produce electromagnetic radiation even when the logic values applied to the output signal pads are slowly varying in relation to the clocking frequency used on the semiconductor device. Consider, as an example, a microcontroller or processor having a core frequency operating at 48 Mega-Hertz (MHz). In testing such an illustrative device, the inventors of the present specification have found that slowly varying output signal pads (e.g., toggling at a rate of 1 Hz or 1000 Hz) showed relatively high electromagnetic radiation at integer multiples of the core frequency.

Further investigation reveals two possible explanations, either or both of which may contribute to the electromagnetic radiation from the slowly varying output signal pads. FIG. 1 shows a simplified output buffer for a single output signal pad 12 in order to more fully describe the two possible underlying causes of the electromagnetic radiation from the output signal pad 12. In particular, an ENABLE and a DATA signal area applied to a control circuit 14. When the ENABLE signal is not asserted, output signal pad 12 is "tri-stated" by having both the transistor 16 and transistor 18 in a non-conductive state. When DATA is present, ENABLE signal is asserted and the control circuit 14 selectively controls the "switches" 20 and 22 to drive appropriate states to the output signal pad 12. For example, to drive a logic high voltage state to the output signal pad 12, the transistor 16 is driven fully conductive by operation of switch 20. In so doing, the output signal pad 12 is pulled to the voltage of the power rail 24. Likewise to drive a logic low voltage state to the output signal pad 12, the transistor 18 is driven fully conductive by operation of switch 22. In so doing, the output signal pad 12 is pulled to the voltage of the ground or common rail 26.

Still referring to FIG. 1, the inventors of the present specification have found that while in theory the voltages on the power rail 24 and common rail 26 should be purely direct current (DC) values, in practice one or both the rails 24, 26 have the DC and a parasitic alternating current (AC) component "riding" the DC component. Thus, in the illustrative situation where the output signal pad 12 is pulled high to the power rail 24 voltage by way of transistor 16, the AC component is likewise fed to the output signal pad 12 with little or no attenuation. The AC component then becomes the driving voltage/current for the electromagnetic radiation from the output signal pad 12. Likewise, when the output signal pad 12 is pulled low to the common rail 26 voltage by way of transistor 18, the AC component on the common rail 26 is fed to the output signal pad 12 with little or no attenuation. Here too the AC component becomes the driving voltage/current for electromagnetic radiation from the output signal pad 12. Thus, even when the Boolean values applied to an output signal pad are slowly varying in relation to a core frequency, the output signal pads still are susceptible to becoming antennas for radiation of electromagnetic radiation.

The various embodiments address the problems noted above by controlling impedance of the devices through which the output signal pads are driven. In particular, the various embodiments initially provide a low drive impedance to enable sufficiently fast rise times of the applied voltages, but when a particular Boolean state is to be driven to the output signal pad for an extended period of time relative to the clock frequency of the data to be transmitted, the impedance is increased and the increased impedance acts to attenuate the AC components coupled to the output signal pad and thus reduce electromagnetic radiation from the output signal pad as compared to buffers that do not adjust impedance.

Figure 2:
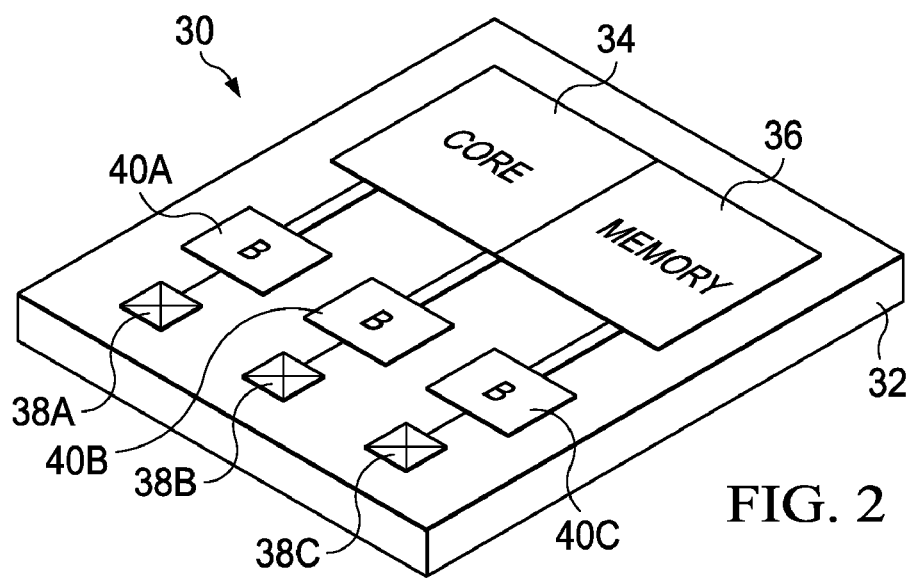
FIG. 2 shows a semiconductor device in accordance with at least some embodiments.

FIG. 2 illustrates a semiconductor device 30 in accordance with at least some embodiments. In particular, the semiconductor device 30 comprises a substrate 32 upon which the various electrical circuits are constructed using semiconductor fabrication techniques. The illustrative semiconductor device 30 is a microcontroller, and thus comprises a processor core 34 and a memory 36 coupled to the core 34. In other embodiments, semiconductor device may be a processor rather than a microcontroller, and as such processor core 34 may have greater computing power (e.g., higher frequency, larger bus width), and the memory 36 may be omitted or possibly used as onboard data and/or instruction cache.

Regardless of the precise configuration of the processor core 34 and memory 36, the semiconductor device 30 further comprises a plurality of output signal pads 38. While only three output signal pads 38 are illustrated, depending on the functionality of the semiconductor device 30 there may be many tens or even hundreds of output signal pads 38. The output signal pads 38 may couple to external devices in many ways. In some embodiments, the semiconductor device 30 is packaged and the output signal pads couple to externals pin in any suitable fashion (e.g., wire leads). In other embodiments, the output signal pads 38 may couple to other semiconductor devices through a variety of coupling techniques (e.g., flip-chip coupling using solder balls).

The output signal pads 38 couple to the core 34 and/or memory 36 through buffer circuits (B) 40. The buffer circuits implement application of the appropriate voltage level when Boolean values are being driven to the output signal pads, and also the buffer circuits implement tri-stating of the output signal pads 38 when commanded to do so. Further, and in accordance with the various embodiments, the buffer circuits 40 reduce electromagnetic radiation from their respective output signal pads 38 by selective control of the impedance of devices through which the output signal pads are driven.

Figure 3:
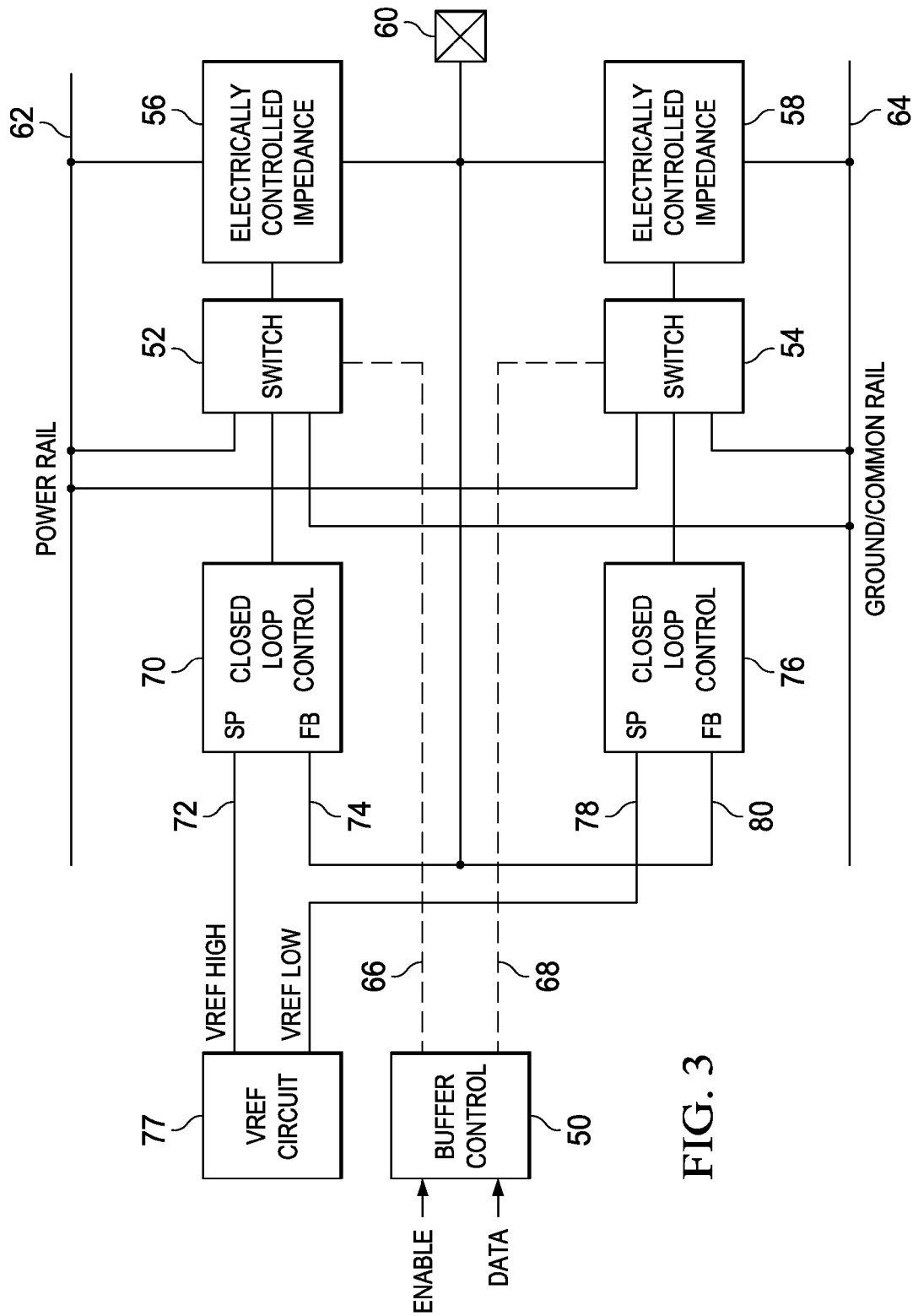
FIG. 3 shows, in block diagram form, a buffer circuit in accordance with at least some embodiments.

FIG. 3 shows, in block diagram form, a single buffer circuit and respective output signal pad in accordance with at least some embodiments. In particular, FIG. 3 illustrates an ENABLE signal and DATA signal coupled to a buffer control circuit 50. Responsive to the states of the ENABLE signal and the DATA, the buffer control circuit 50 applies control signals to each of the switch circuits 52 and 54. The switch circuits 52, 54 select a signal to be applied to the respective electronically controlled impedances 56 and 58. Electronically controlled impedance 56 may be any single device, or array of devices that, based on control signals supplied from the switch circuit 52, couples the power rail 62 to the output signal pad 60 through a high impedance (off or non-conductive state), a low impedance (on or conductive state), or an intermediate impedance (on, but with intermediate impedance). Likewise, electronically controlled impedance 58, based on control signals supplied from switch circuit 54, couples the ground or common rail 64 to the output signal pad 60 through a high impedance (off or non-conductive state), a low impedance (on or conductive state), or an intermediate impedance (on, but with intermediate impedance).

When ENABLE is not asserted, the buffer control circuit 50 instructs the switch circuits 52, 54 (the instructing by signals propagated along dashed lines 66 and 68) to "tri-state" the output signal pad 60. For example, when electronically controlled impedance 56 is supplied a particular signal, the electronically controlled impedance 56 assumes a high impedance or off state. The signal supplied through the switch circuit 52 to achieve the state is dependent upon the type of electronically controlled impedance, and may be, for example, either the power rail voltage or the common rail voltage. Particular examples are given later in the discussion. The switch circuit 54 and controlled impedance 58 act similarly when "tri-stating" the output signal pad 60.

Now consider that ENABLE is asserted, and that DATA is a logic high voltage. Responsive to the signal from the buffer control circuit 50 the switch circuit 54 couples a voltage to the controlled impedance 58 which drives the controlled impedance 58 to a high impedance state (off or non-conducting). However, and again responsive to the signals from the buffer control circuit 50, the switch circuit 52 couples a voltage to the controlled impedance 56 which drives the controlled impedance to a low impedance state (on or conducting). The low impedance state causes the power rail 62 to pull the output signal pad 60 to a logic high voltage (i.e., to the voltage of the power rail). Further consider that ENABLE remains asserted and DATA remains at a logic high level for a predetermined period of time (e.g, with a core running at 48 MHz, more than about 2 cycles of the core clock (or 42 to 50 nano-seconds (ns)). In accordance with at least some embodiment, when DATA (and thus the voltage on the output signal pad) remain at a logic high voltage for a predetermined period of time, the buffer control circuit 50 commands the switch circuit 52 to couple the controlled impedance 56 to the closed loop control circuit 70.

In accordance with the various embodiments, the closed loop control circuit 70 is configured to command the controlled impedance 56 to increase impedance through the device (from the initial driving of the output signal pad 60), yet still maintain sufficient voltage on the output signal pad 60 that the logic state remains unchanged. In order to perform this task, and in accordance with at least some embodiments, the closed loop control circuit 70 is provided a set point (SP) voltage or signal 72 and a feedback (FB) voltage or signal 74. As illustrated, the set point voltage 72 is provided from a voltage reference circuit 77, and the feedback signal 74 is provided from the output signal pad 60. Responsive to the set point and feedback, the closed loop control circuit 70 provides a varying control signal to the controlled impedance 56 (through switch circuit 52) which increases the impedance (as compared to the initial driving) and moreover controls the voltage level based on the set point and feedback signals. In some embodiments, the closed loop control circuit 70 is provided a set point voltage of approximately 90% of the voltage on the power rail 62, and the closed loop control circuit 70 controls the voltage on the output signal pad 60 to be the illustrative 90% of the power rail voltage. Even at 90% of power rail voltage, however, the Boolean state on the output signal pad 60 is still considered a logic high voltage. The increased impedance (to achieve the slightly lowered set point voltage) tends to attenuate AC signals on the power rail 62 that couple to the output signal pad 60, and thus reduce electromagnetic radiation from the output signal pad 60 caused by the AC signals. In situations where the load is predominantly capacitive and load current approaches zero amps (e.g., in complimentary metal-oxide semiconductor (CMOS) devices), the impedance approaches infinity and thus the attenuation of the AC component is substantial.

Still referring to FIG. 3, now consider that the ENABLE signal is asserted, and that the DATA is a logic low voltage. Responsive to the signal from the buffer control circuit 50 the switch circuit 52 couples a voltage to the controlled impedance 56 which drives the controlled impedance 56 to a high impedance state (off or non-conducting). However, and again responsive to the signals from the buffer control circuit 50, the switch circuit 54 couples a voltage to the controlled impedance 58 which drives the controlled impedance to a low impedance state (on or conducting). The low impedance state causes the common rail 64 to pull the output signal pad 60 to a logic low voltage (i.e., to the voltage of the common rail). Further consider that ENABLE remains asserted and DATA remains at a logic low voltage for a predetermined period of time (e.g, more than about 2 cycles of the core clock or 42 to 50 ns). In accordance with at least some embodiment, the when DATA (and thus the voltage on the output signal pad) remain at a logic low voltage for a predetermined period of time, the buffer control circuit 50 commands the switch circuit 54 to couple the controlled impedance 58 to the closed loop control circuit 76.

In accordance with the various embodiments, the closed loop control circuit 76 is configured to command the controlled impedance 58 to increase impedance through the device (from the initial driving of the output signal pad 60), yet still maintain a voltage on the output signal pad 60 such that the logic state remains unchanged. In order to perform this task, and in accordance with at least some embodiments, the closed loop control circuit 76 is provided a set point signal 78 and a feedback signal 80. As illustrated, the set point voltage 78 is provided from a voltage reference circuit 77, and the feedback signal 80 is provided from the output signal pad 60. Responsive to the set point and feedback, the closed loop control circuit 76 provides a varying control signal to the controlled impedance 58 (through switch circuit 54) which increases the impedance (as compared to the initial driving) and moreover controls the voltage level based on the set point and feedback signals. In some embodiments, the closed loop control circuit 76 is provided a set point voltage of approximately 10% of the voltage on the power rail 62, and the closed loop control circuit 70 controls the voltage on the output signal pad 60 to be the illustrative 10% of the power rail voltage. Even at 10% of power rail voltage, however, the Boolean state on the output signal pad 60 is still considered a logic low voltage. The increased impedance (to achieve the slightly raised set point voltage) tends to attenuate AC signals on the common rail 64 that couple to the output signal pad 60, and thus reduce electromagnetic radiation from the output signal pad 60 caused by the AC signals.

Summarizing before continuing, initially a particular voltage signal is driven to the output signal pad though a low impedance coupling. If the particular voltage level remains for a predetermined period time (e.g., 50 ns), then the impedance between the rail and the output signal pad 60 is increased such that the logic voltage state is still considered present, but where any AC component on the rail is attenuated as it propagates to the output signal pad 60, and electromagnetic radiation from the output signal pad 60 is correspondingly reduced. As illustrated in FIG. 3, the control methodology is implemented both with respect to driving the output signal pad substantially to the voltage of the power rail 62, and driving (e.g., sinking current from) the output signal pad substantially to the voltage of the common rail 64. However, in other embodiments the control methodology may be implemented with respect to a single rail. For example, the inventors have found that the parasitic AC signals are, in some situations, more prevalent on the common rail 64 than the power rail 62. In such situations, the impedance change/control discussed above may be implemented with respect to the common rail 64 coupling to the output signal pad, and may be omitted with respect to the power rail 64 coupling to the output signal pad 60. The specification now turns to a few specific illustrative embodiments.

Figure 4:
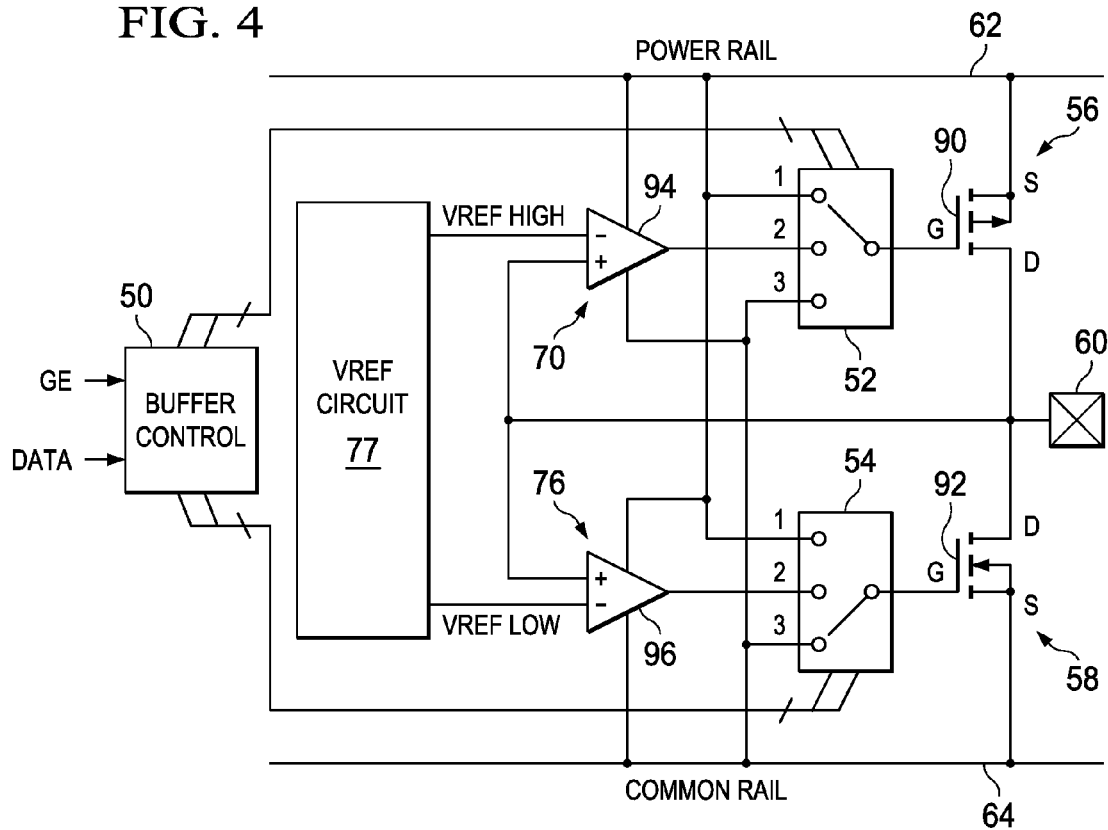
FIG. 4 shows a buffer circuit in accordance with at least some embodiments.

FIG. 4 shows a buffer circuit in accordance with at least some embodiments. There are many devices illustrated in FIG. 4, but in accordance with at least some embodiments all the devices are constructed on a common semiconductor substrate. Thus, the individual components shown should not necessarily be construed to imply the assembly of individual and/or discrete components. FIG. 4 shows the electrically controlled impedances 56, 58 as field effect transistors (FETs) 90, 92 respectively. FETs 90, 92 are merely illustrative of a family of transistors that may be used (e.g., metal oxide semiconductor FETs (MOSFETs), as well as bipolar junction transistors). In particular, FET 90 is a p-channel MOSFET, and FET 92 is an n-channel MOSFET. The source of FET 90 couples the power rail 62, and the drain couples to the output signal pad 60. Likewise, the drain of FET 92 couples to the output signal pad 60, and the source couples to the common rail 64. The gate of FET 90 couples to the switch circuit 52, illustrated as a three-position switch. Likewise the gate of FET 92 couples to the switch circuit 54, also illustrated as a three-position switch. It will be understood that switch circuit 52 and 54 are not physical switches, but instead are transistors constructed on the semiconductor substrate 32 (FIG. 2) configured to act as switches. With reference to switch circuit 52, the three input signals from which the switch circuit 52 may select are a high voltage from the power rail (on input 1), a low voltage from the common rail 64 (on input 3) and a variable voltage from the closed loop control circuit 70 (on input 2), illustrated as an operational amplifier 94. Similarly with reference to switch circuit 54, the three input signals from which the switch circuit 54 may select are a high voltage from the power rail (on input 1), a low voltage from the common rail 64 (on input 3) and a variable voltage from the closed loop control circuit 76 (on input 2), illustrated as an operational amplifier 96.

As shown in FIG. 4, in some embodiments the closed loop control circuits 70 and 76 are implemented as respective operational amplifiers 94 and 96. Other closed loop control circuits may be equivalently used; however, operational amplifiers provide sufficient control without the need of designing specialty control circuits. Each operational amplifier has its non-inverting input coupled to the output signal pad 60 (the feedback signal), and its inverting input coupled to a voltage reference (set point signal) provided by voltage reference circuit 77. As above, the set point voltages from the voltage reference circuit 77 are predetermined voltages at which the closed loop control circuits 70 and 76 should control voltage. In some embodiments the "Vref High" voltage is 90% of the power rail 62 voltage, and the "Vref Low" voltage is 10% of the power rail 62 voltage, but other set points may be equivalently used. Although the voltage on the output signal pad 60 couples to the non-inverting input of each illustrative operational amplifier 94, 96, the feedback is actually a negative feedback because of the signal inversion (relative to the output signal from each operational amplifier) caused by the respective FETs 90 and 92.

The buffer circuit of FIG. 4 is shown in a "tri-state" condition, as would be the case with ENABLE de-asserted. Now consider that ENABLE has been previously asserted, and DATA transitions from a logic high voltage to a logic low voltage. In this situation, the buffer control circuit 50 (through switch circuit 52) places FET 90 in a high impedance condition (i.e., off, such as by coupling the gate to the power rail 62), and couples the gate of FET 92 to a high voltage, such as by changing the switch circuit 54 to couple position 1 to the gate and thus coupling the gate to the power rail 62 voltage. Coupling the gate of the FET 92 to the power rail 62 drives the FET 92 to low impedance state (i.e., initially to a saturation mode, but as the drain-to-source voltage drops, the transistor may move to the active mode even though no change in gate-to-source voltage has occurred). After a predetermined period of time (e.g., 2 clock cycles), if the DATA has not changed, the buffer control circuit 50 then commands the switch circuit 54 to couple position 2 (from the operational amplifier) to the gate. The illustrative operational amplifier 96 then, in a closed loop fashion, controls the voltage on the output signal pad 60 to be at or below 10% of the power rail 62 voltage by supplying a variable voltage to the gate of the FET 92 (though switch circuit 54). In the particular case of FET 92, the voltage applied to the gate of the FET 92 is less than the voltage applied when the gate is coupled to the power rail 62 voltage, and thus impedance from drain-to-source increases.

Figure 5A:
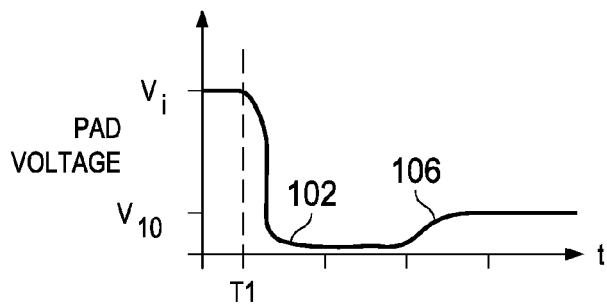
FIG. 5A shows an illustrative voltage as a function of time in a logic high voltage to logic low voltage transition in accordance with at least some embodiments.
Figure 5B:
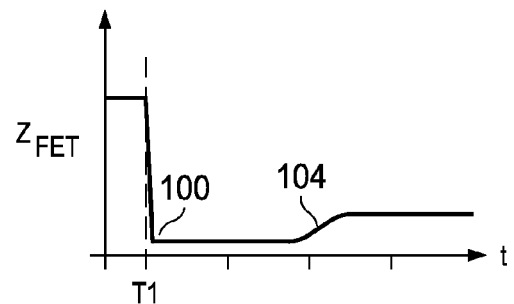
FIG. 5B shows an illustrative impedance a function of time in a logic high voltage-to-logic low voltage transition in accordance with at least some embodiments.

FIGS. 5A and 5B show plots as a function of co-extensive time of output signal pad 60 voltage (FIG. 5A) and illustrative FET 92 impedance (FIG. 5B) in the illustrative transition from a logic high voltage on output signal pad 60 to a logic low voltage on output signal pad 60. In particular, consider that at time T1 DATA transitions from a logic high voltage to a logic low voltage. As above, the power rail 62 voltage applied to the gate of the FET 92 at time T1, which causes the drain-to-source impedance of the FET 92 to drop to low impedance, as indicated at 100. Correspondingly, the initial voltage V1 on the output signal pad 60 drops to a logic low voltage, as indicated at 102. If the DATA remains a logic low voltage for the predetermined period time (e.g., 50 ns), then the gate of FET 92 is coupled to the illustrative operational amplifier 96, which changes and then controls the voltage on the gate of FET 92 to achieve a predetermined voltage on the output signal pad 60. In particular, the change in gate voltage changes the drain-to-source impedance of FET 92, as indicated at 104. The change in drain-to-source impedance results in a change in output signal pad 60 voltage toward the set point $V_{10}$ as indicated at 106. As downstream devices change the current applied to the output signal pad, the illustrative operational amplifier 96 continuously monitors and makes corrections to the gate voltage (i.e., to sink more or less current from the output signal pad) to maintain the modified set point $V_{10}$ voltage.

Now consider that ENABLE is asserted, and DATA transitions from a logic low voltage to a logic high voltage. In this situation, the buffer circuit 50 (through switch circuit 54) places FET 92 in a high impedance condition (i.e., off, such as by coupling the gate to the common rail 64), and couples the gate of FET 90 to a low voltage, such as by changing the switch circuit 52 to couple position 3 to the gate and thus coupling the gate to the common rail 64 voltage. In accordance with the various embodiments, coupling the gate of the FET 90 to the common rail 64 drives the FET 90 to low impedance state (i.e., initially to a saturation mode, but as the drain-to-source voltage drops, the transistor may move to the active mode even though no change in gate-to-source voltage has occurred). After a predetermined period of time (e.g., 2 clock cycles), if the DATA has not changed, the buffer control circuit 50 then commands the switch circuit 52 to couple position 2 (from the operational amplifier 94) to the gate. The illustrative operational amplifier 94 then, in a closed loop fashion, controls the voltage on the output signal pad 60 to be 90% of the power rail 62 voltage by supplying a variable voltage to the gate of the FET 90 (though switch circuit 52). In the particular case of FET 90, the voltage applied to the gate of the FET 90 is greater than the voltage applied when the gate is coupled to the common rail 64 voltage, and thus impedance from drain-to-source increases.

Figure 6A:
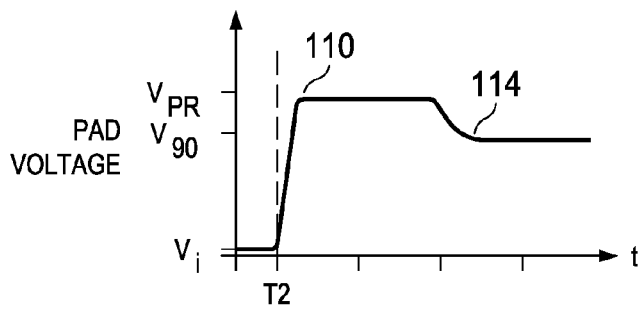
FIG. 6A shows an illustrative voltage as a function of time in a logic low voltage-to-logic high voltage transition in accordance with at least some embodiments.
Figure 6B:
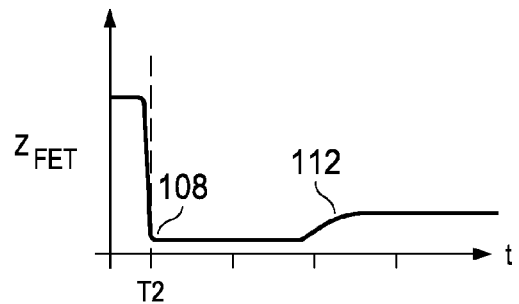
FIG. 6B shows an illustrative impedance a function of time in a logic low voltage-to-logic high voltage transition in accordance with at least some embodiments.

FIGS. 6A and 6B show plots as a function of co-extensive time of output signal pad 60 voltage (FIG. 6A) and illustrative FET 90 impedance (FIG. 6B) in the illustrative transition from a logic low voltage on output signal pad 60 to a logic high voltage on output signal pad 60. In particular, consider that at time T2 DATA transitions from a logic low voltage to a logic high voltage. The common rail 64 voltage is applied to the gate of the FET 90 at time T2, which causes the drain-to-source impedance of the FET 90 to drop to low impedance, as indicated at 108. Correspondingly, the initial voltage V1 on the output signal pad 60 increases to a logic high voltage, as indicated at 110. If the DATA remains a logic high voltage for the predetermined period time (e.g., 50 ns), then the gate of FET 90 is coupled to the illustrative operational amplifier 94, which changes and then controls the voltage on the gate of FET 90 to achieve a predetermined voltage on the output signal pad 60. In particular, the change in gate voltage changes the drain-to-source impedance of FET 90, as indicated at 112. The change in drain-to-source impedance results in a change in output signal pad 60 voltage toward the set point $V_{90}$ as indicated at 114. As downstream devices draw more or less current, the illustrative operational amplifier 94 continuously monitors and makes corrections to the gate voltage (i.e., to provide more or less current from the output signal pad) to maintain the modified set point $V_{90}$ voltage.

Figure 7:
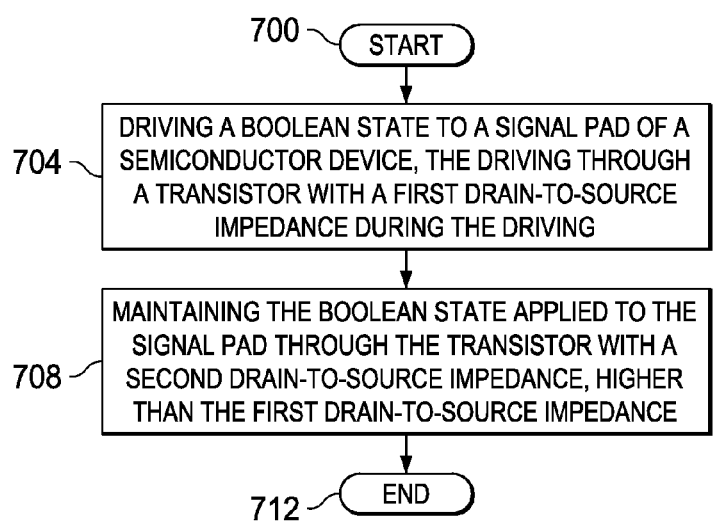
FIG. 7 shows a method in accordance with at least some embodiments.

FIG. 7 illustrates a method in accordance with at least some embodiments. In particular, the method starts (block 700), and proceeds to driving a Boolean state to a signal pad of a semiconductor device, the driving through a transistor with a first drain-to-source impedance (block 704). For example, the driving may be through a first transistor by applying a gate-to-source voltage that places the transistor, initially at least, in a saturation mode of conduction. Next, the Boolean state applied to the signal pad is maintained by a transistor with a second drain-to-source impedance, higher than the first drain-to-source impedance (block 708), and the method ends (block 712). The transistor with the first drain-to-source impedance, and the transistor with the second drain-to-source impedance may be the same transistor or different transistors. In either case, it is contemplated that the voltage applied to the gates as between driving and maintaining will be different voltages, thus modulating impedance of the output drivers.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of a semiconductor device for reducing electromagnetic radiation of the semiconductor device, comprising:
    driving a Boolean state to a signal pad of a semiconductor device, the driving through a transistor with a first drain-to-source impedance during the driving;
    maintaining the Boolean state applied to the signal pad through the transistor with a second drain-to-source impedance, higher than the first drain-to-source impedance, wherein maintaining further comprises at least one of driving the gate input with a second voltage and an output signal of an operational amplifier; and
    controlling drain-to-source impedance of the transistor and holding the Boolean state at a determine voltage range for reducing the electromagnetic radiation of the semiconductor device.

2. The method of claim 1 further comprising:
    wherein driving through the transistor further comprises driving a gate input of the transistor with a first voltage that places the first transistor substantially within a saturation mode.

3. The method of claim 1 wherein driving further comprises driving through at least one selected from the group consisting of: a metal oxide semiconductor field effect transistor (MOSFET); a P-channel MOSFET; and a N-channel MOSFET.

4. A system comprising:
    a processor core;
    power rail;
    a ground rail;
    an external electrical connection; and
    an output buffer coupled the processor core, power rail, ground rail, and the external electrical connection, the output buffer comprising:
        a first transistor that defines a source, drain and gate;
        the drain coupled to the external electrical connection; and
        the source coupled to the ground rail;
    the system is configured to drive a logic low voltage state to the external electrical connection during a first period of time;
    the system is configured to induce a first drain-to-source impedance of the first transistor during a first portion of the first period of time; and
    the system is configured to induce a second drain-to-source impedance, higher than the first drain-to-source impedance, during the second portion of the first period of time to control the drain-to-source impedance of the transistor and to hold the Boolean state at a determine voltage range for reducing the electromagnetic radiation of the semiconductor device;
    an operational amplifier that defines a first and second input signals and an output signal;
    the output signal selectively coupled to the gate of the first transistor;
    the first input signal coupled to the external electrical connection; and
    the second input signal coupled to a predetermined voltage reference;
    when the system induces the second drain-to-source impedance, the operational amplifier is configured to control a voltage applied to the gate based on a relationship of the voltage on the external electrical connection and the predetermined voltage reference.

5. The system of claim 4 further comprising:
    a switch circuit configured to selectively couple the gate of the first transistor to the power rail, couple the gate of first transistor the output signal of the operational amplifier, and couple the gate of the first transistor to the ground rail;
    when the system induces the second drain-to-source impedance, the switch circuit couples the gate of the first transistor to the output signal of the operational amplifier.

6. The system of claim 4 further comprising:
    the output buffer further comprises:
        a second transistor that defines a source, drain and gate;
        the drain of the second transistor coupled to the external electrical connection; and
        the source of the second transistor coupled to the power rail;
    the system is configured to drive a logic high voltage state to the external electrical connection during second period of time;
    the system is configured to induce a third drain-to-source impedance of the second transistor during a first portion of the second period of time; and
    the system is configured to induce a fourth drain-to-source impedance, higher than the third drain-to-source impedance, of the transistor during a second portion of the second period of time.

7. The system of claim 6 further comprising:
    an operational amplifier that defines a first and second input signals and an output signal;
    the output signal selectively coupled to the gate of the second transistor;
    the first input signal coupled to the external electrical connection; and
    the second input signal coupled to a predetermined voltage reference;

when the system induces the fourth drain-to-source impedance, the operational amplifier is configured to control a voltage applied to the gate based on a relationship of the voltage on the external electrical connection and the predetermined voltage reference.

8. The system of claim 4 wherein the first transistor is at least one selected from the group consisting of: a metal oxide semiconductor field effect transistor (MOSFET); a P-channel MOSFET; and an N-channel MOSFET.

9. A method of reducing electromagnetic interference comprising:
   driving a Boolean state to a signal pad of semiconductor device through a transistor by applying a first voltage to the gate of the transistor;
   maintaining the Boolean state applied to the signal pad through a transistor by applying a second voltage, different than the first voltage, to the gate of the transistor; and
   controlling drain-to-source impedance of the transistor and holding the Boolean state at a determine voltage range for reducing the electromagnetic radiation of the semiconductor device and controlling a gate input with an output signal of an operational amplifier.

10. The method of claim 9 wherein driving through a first transistor further comprises driving through at least one selected from the group consisting of: a metal oxide semiconductor field effect transistor (MOSFET); a P-channel MOSFET; and an N-channel MOSFET.

11. A semiconductor device comprising:
   means for distributing a voltage common connection across the semiconductor device;
   means for coupling a signal to an external device;
   means for reducing electromagnetic radiation from the means for coupling caused, at least in part, by alternating current (AC) signals on the means for distributing; and
   controlling drain-to-source impedance of the transistor and holding the Boolean state at a determine voltage range for reducing the electromagnetic radiation of the semiconductor device and controlling a gate input with an output signal of an operational amplifier.

12. The semiconductor device of claim 11 wherein the means for reducing further comprises:
   means for driving with a first impedance the means for coupling;
   means for driving with a second impedance, lower than the first impedance, the means for coupling.

13. The semiconductor device of claim 11 wherein the means for reducing further comprises:
   means for driving the means for coupling with variable drive impedance;
   means for controlling the impedance of the means for driving;
   means for controlling configured to control the drive impedance of the means for driving to be a first impedance during an initial transition of driving a logic state to the means for coupling; and
   means for controlling configured to control the drive impedance of the means for driving to be a second impedance, higher than the first impedance, during subsequent driving of the logic state.

14. The semiconductor device of claim 11 further comprising:
   means for reducing electromagnetic radiation from the means for coupling caused, at least in part, by AC signals on the means for distributing the voltage source.

* * * * *